US 6,737,692 B2

(12) United States Patent
Gabric et al.

(10) Patent No.: US 6,737,692 B2
(45) Date of Patent: May 18, 2004

(54) METHOD FOR FABRICATING A COMPONENT, AND COMPONENT HAVING A METAL LAYER AND AN INSULATION LAYER

(75) Inventors: Zvonimir Gabric, Zorneding (DE); Werner Pamler, München (DE); Volker Weinrich, Paris (FR)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/370,858

(22) Filed: Feb. 20, 2003

(65) Prior Publication Data

US 2003/0157798 A1 Aug. 21, 2003

(30) Foreign Application Priority Data

Feb. 20, 2002 (DE) .......................... 102 07 130

(51) Int. Cl.[7] .............................................. H01L 29/76
(52) U.S. Cl. ..................... 257/295; 257/306; 257/753; 257/763
(58) Field of Search ................ 257/295, 296, 257/297, 753, 763, 764, 765, 313, 306, 301, 309; 438/3, 396, 253, 254, 268, 240, 239, 293, 399

(56) References Cited

U.S. PATENT DOCUMENTS

| 5,668,040 | A  |   | 9/1997  | Byun |
|-----------|----|---|---------|------|
| 5,798,903 | A  | * | 8/1998  | Dhote et al. ............. 361/321.4 |
| 6,139,971 | A  | * | 10/2000 | Bruchhaus et al. .......... 428/446 |
| 6,184,550 | B1 | * | 2/2001  | Van Buskirk et al. ...... 257/306 |
| 6,278,150 | B1 |   | 8/2001  | Okudaira et al. |
| 6,284,654 | B1 | * | 9/2001  | Roeder et al. ............. 438/681 |
| 6,309,894 | B1 | * | 10/2001 | Miki et al. ..................... 438/3 |
| 6,342,712 | B1 | * | 1/2002  | Miki et al. ................. 257/295 |

(List continued on next page.)

FOREIGN PATENT DOCUMENTS

| DE | 25 25 482 A1 | 1/1976 |
| DE | 196 01 592 C1 | 5/1997 |
| DE | 198 28 969 A1 | 12/1999 |
| DE | 198 60 080 A1 | 7/2000 |
| DE | 199 09 295 A1 | 9/2000 |
| DE | 199 19 110 C2 | 11/2000 |
| EP | 0 113 522 A2 | 7/1984 |
| EP | 0 697 718 A1 | 2/1996 |

OTHER PUBLICATIONS

Muraka, S. P.: "Silicides for VLSI Applications", Academic Press, 1983, pp. 102–107 and 136–143.

Mantl, S.: "Silicid–Mikrostruckturen durch locale Oxidation" [Silicides Micro Structures through Local Oxidation], Physikalische Blätter 51, No. 10, VCH, Weinheim, 1995, pp. 951–953.

Canali, C. et al.: "$Pt_2Si$ and $PtSi$ Formation with High–Purity Pt Thin Films", Applied Physics Letters, vol. 31, No. 1, Jul. 1, 1977, pp. 43–45.

Yamada, K. et al.: "Formation of Metal Silicide–Silicon Contact with Ultralow Contact Resistance by Silicon–Capping Silicidation Technique", Appl. Phys. Lett., vol. 64, No. 25, American Institute Of Physics, Jun. 20, 1997, pp. 3449–3451.

*Primary Examiner*—Michael S. Lebentritt
(74) *Attorney, Agent, or Firm*—Laurence A. Greenberg; Werner H. Stemer; Gregory L. Mayback

(57) ABSTRACT

A method for improving the adhesion between a noble metal layer and an insulation layer includes configuring a silicon layer between the noble metal layer and the insulation layer. The silicon layer is siliconized and oxidized by a thermal treatment in an oxidative environment, resulting in an oxidized silicide layer with high intermixing of the noble metal and the formed oxide. The relatively large inner surface achieved as a result improves the adhesion between the noble metal layer and the insulation layer.

5 Claims, 13 Drawing Sheets

U.S. PATENT DOCUMENTS

| | | | | |
|---|---|---|---|---|
| 6,350,643 B1 | * | 2/2002 | Hintermaier et al. | 438/240 |
| 6,396,092 B1 | * | 5/2002 | Takatani et al. | 257/295 |
| 6,495,413 B2 | * | 12/2002 | Sun et al. | 438/240 |
| 6,512,259 B1 | * | 1/2003 | Lange et al. | 257/306 |
| 6,555,431 B1 | * | 4/2003 | Xing et al. | 438/253 |
| 6,573,542 B2 | * | 6/2003 | Bruchhaus et al. | 257/295 |
| 6,576,482 B1 | * | 6/2003 | Aggarwal et al. | 438/3 |
| 6,596,547 B2 | * | 7/2003 | Aggarwal et al. | 438/3 |
| 6,635,498 B2 | * | 10/2003 | Summerfelt et al. | 438/3 |

\* cited by examiner

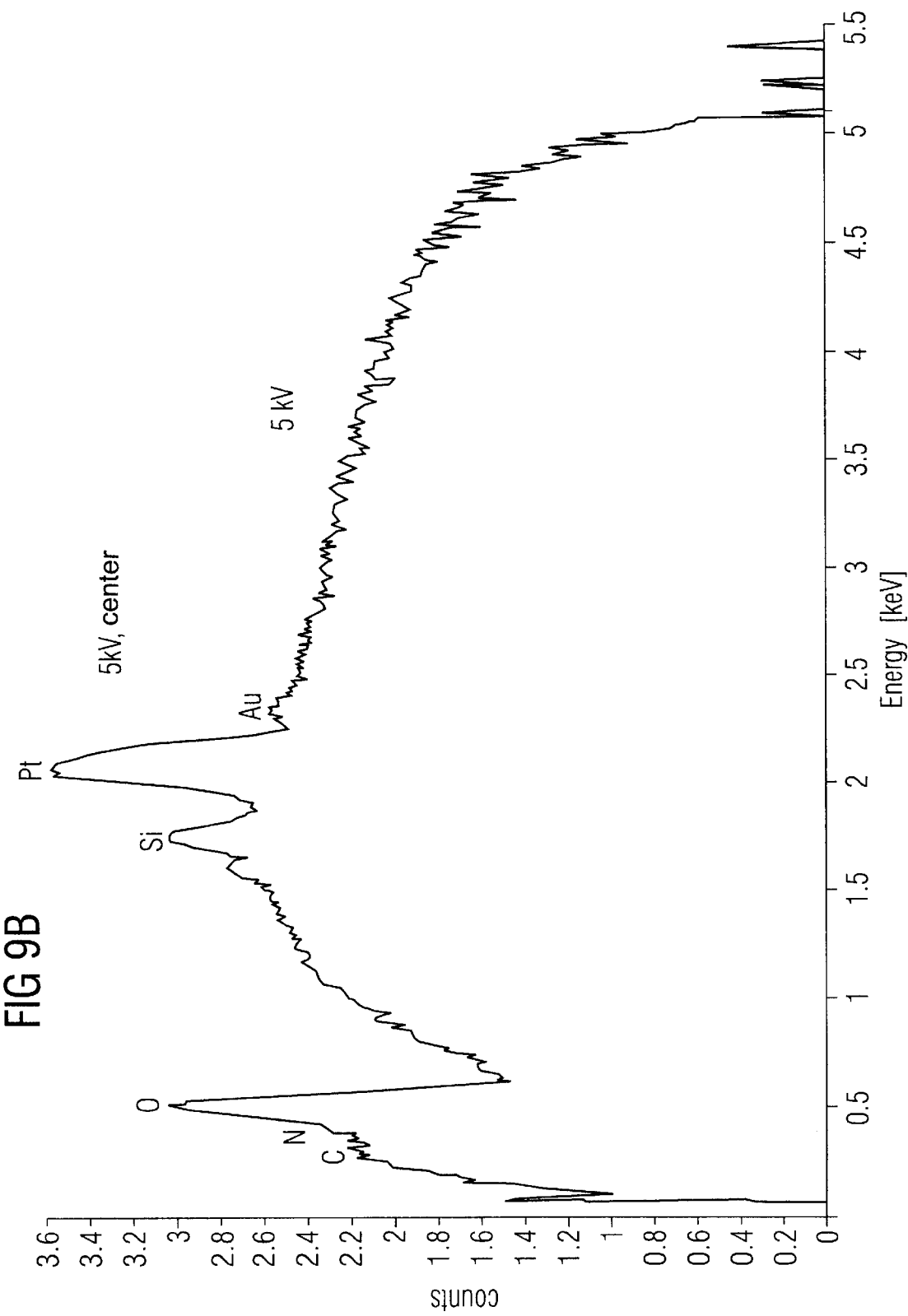

METHOD FOR FABRICATING A COMPONENT, AND COMPONENT HAVING A METAL LAYER AND AN INSULATION LAYER

BACKGROUND OF THE INVENTION

Field of the Invention

The invention lies in the field of components, in particular microelectronic components and specifically in the field of semiconductor memories.

During the fabrication of components, layers of different materials are successively applied and patterned. In order to ensure the reliability of the fabricated components, the applied layers must have a sufficient adhesion. What is problematic is e.g. the adhesion of insulation materials, e.g. silicon oxide and silicon nitride, on noble metals and other metals that are difficult to oxidize, in particular those from subgroup VIIIb of the periodic table.

Platinum or iridium is used e.g. in the fabrication of the capacitor electrodes of semiconductor memories with a ferroelectric or high-∈-dielectric (∈ generally greater than 20) capacitor dielectric, since this metal is sufficiently resistant to the process conditions required for the deposition of the capacitor dielectric. In particular, the electrodes have to withstand an oxidation at elevated temperatures. However, the pronounced chemical inertness is more of a disadvantage with regard to the adhesion to the standard insulation material used in semiconductor technology. It is presumed that a good adhesion between two layers is connected with a certain chemical interaction or interdiffusion of the adjacent layers. By way of example, a $TiAl_3$ layer forms between titanium and aluminum, and has a favorable effect on the adhesion. Formation of a metal oxide layer in a manner beneficial to adhesion is also observed when depositing metals that are relatively easy to oxidize onto silicon oxide.

In the case of the noble metals or other metals that are difficult to oxidize, there is very little chemical interaction with e.g. oxide layers. Therefore, problems with the adhesion occur particularly frequently in this case. This is critical particularly in the case of increasingly smaller structures, as are found e.g. in semiconductor memories. In that case, the electrodes are formed e.g. by deposition onto a prepatterned insulation layer with subsequent polishing-back (CMP= chemical mechanical polishing). The rotating grinding wheel used for the polishing-back in this case exerts a certain mechanical pressure on the deposited metal layer, which pressure, for lack of adhesion, can lead to a stripping away of the metal layer. Furthermore, cleaning steps after possible etching patterning of the metal layer or during the ultrasonic bonding of finished processed semiconductor chips have also been found to be a particular mechanical burden.

In order to improve the adhesion of noble metals, for example of a storage capacitor of a semiconductor memory, U.S. Pat. No. 5,668,040, teaches providing a layer of a transition metal, e.g. from subgroup IVb, Vb or VIb, between the noble metal of the bottom capacitor electrode and the insulation layer including silicon oxide. This transition metal forms a metal nitride layer at the interface with the noble metal layer during a thermal treatment in an ammonia-containing atmosphere. In this case, the noble metal layer does not react with nitrogen or the transition metal. Furthermore, a metal oxide layer forms at the interface between the transition metal and silicon oxide. What is problematic with this approach, however, is that the etched edges of the transition metal comes into contact with the capacitor dielectric that is subsequently applied, and is oxidized at least there. Moreover, transition metal can diffuse into the capacitor dielectric and impair the dielectric or ferroelectric properties thereof.

In order to avoid the diffusion of a transition metal into the capacitor dielectric, it is possible, as proposed e.g. in Published European Patent Application EP 0 697 718 A1, for the deposition of the capacitor dielectric to be preceded by an oxidation of the edges of the transition metal, in the case of which, however, a considerable increase in volume is observed which can lead to a mechanical fracture of the noble metal layer seated on the transition metal layer. Moreover, the cross section available for the contact connection of the bottom electrode is restricted.

Published German Patent Application DE 198 28 969 A1 describes a method for fabricating a semiconductor component in which a silicon layer is deposited as an adhesion promoter between a top metal electrode of a storage capacitor and an oxide layer.

Issued German Patent DE 196 01 592 C1 discloses, for the purpose of improving the adhesion of a platinum layer on a dielectric carrier layer of a sensor, providing a platinum silicide layer between the dielectric carrier layer and the platinum layer. The platinum silicide layer is fabricated by siliconizing a silicon layer applied before the deposition of the platinum layer.

SUMMARY OF THE INVENTION

It is accordingly an object of the invention to provide a method for fabricating a component, which overcomes the above-mentioned disadvantages of the prior art methods of this general type.

In particular, it is an object of the invention to provide a method for fabricating a component with an improved adhesion of a noble metal layer to an insulation layer.

With the foregoing and other objects in view there is provided, in accordance with the invention, a method for fabricating a component including steps of: applying a noble metal layer to a substrate and subsequently applying a silicon layer to the substrate such that a surface of the noble metal layer contacts the silicon layer; performing a siliconization such that the surface of the noble metal layer contacting the silicon layer is siliconized; performing an oxidation to oxidize a silicide layer formed from the silicon layer; and applying an insulation layer.

In accordance with an added feature of the invention, when performing the oxidation step, unsiliconized regions of the silicon layer that may have remained are oxidized.

In accordance with an additional feature of the invention, the siliconization step is effected in situ while performing the step of applying the silicon layer.

In accordance with another feature of the invention, the method includes patterning the noble metal layer before performing the step of applying the silicon layer.

In accordance with a further feature of the invention, the method includes: performing the step of applying the noble metal layer by applying the noble metal layer to a ferroelectric or dielectric capacitor dielectric covering a further noble metal layer; forming a stack by patterning the further noble metal layer, the capacitor dielectric, and the noble metal layer using a common mask; and conformally depositing the silicon layer onto the stack, and siliconizing and oxidizing the silicon layer such that the silicon layer is completely oxidized in a region directly contacting the capacitor dielectric.

In accordance with a further added feature of the invention, the step of applying the insulation layer is performed after the step of performing the oxidation.

In accordance with a further additional feature of the invention, the method includes: before performing the oxidation, patterning the noble metal layer and the silicon layer by using a lithographically fabricated mask.

In accordance with yet an added feature of the invention, the method includes: introducing at least one contact hole into the insulation layer and into the oxidized silicide layer; and filing the contact hole with a conductive material producing an electrically conductive connection to the noble metal layer.

In accordance with yet an additional feature of the invention, the method includes: after forming the contact hole, removing silicide located at a bottom of the contact hole.

In accordance with yet another feature of the invention, the method includes: fabricating a semiconductor memory having a plurality of storage capacitors, each one of the plurality of storage capacitors having two electrodes and a capacitor dielectric lying between the two electrodes, at least one of the two electrodes being formed by the noble metal layer.

With the foregoing and other objects in view there is also provided, in accordance with the invention, a method for fabricating a component, which includes steps of: applying an insulation layer to a substrate, subsequently applying a silicon layer to the substrate, and subsequently applying a noble metal layer to the substrate such that a surface of the noble metal layer contacts the silicon layer; performing a siliconization such that the surface of the noble metal layer contacting the silicon layer is siliconized; and performing an oxidation to oxidize a silicide layer formed from the silicon layer.

In accordance with an added feature of the invention, when performing the oxidation step, unsiliconized regions of the silicon layer that may have remained are oxidized.

In accordance with an additional feature of the invention, the method includes: performing the siliconization step and the oxidation step during a common thermal treatment in an oxygen-containing atmosphere.

In accordance with another feature of the invention, the thermal treatment is performed in a presence of water vapor.

In accordance with a further feature of the invention, in the oxidation step, the silicide layer and unsiliconized regions of the silicon layer that may have remained are completely oxidized.

In accordance with a further added feature of the invention, the method includes: coordinating a thicknesses of the silicon layer and a thickness of the noble metal layer with one another such that, in an event of a complete siliconization of the silicon layer, the noble metal layer is only partially consumed and a surface of the noble metal layer that is remote from the silicon layer remains essentially free of suicides.

In accordance with a further additional feature of the invention, the step of applying the noble metal layer includes applying the noble metal layer with a thickness 10 to 20 times greater than a thickness of the silicon layer.

With the foregoing and other objects in view there is also provided, in accordance with the invention, a method for fabricating a component, which includes steps of: applying a noble metal layer to a substrate; at an elevated temperature, exposing the noble metal layer to an atmosphere including at least one silane so that a silicide layer is formed at a surface of the noble metal layer; and applying an insulation layer.

In accordance with an added feature of the invention, the silane is an unsubstituted silane.

In accordance with an additional feature of the invention, the silane is a carbon-free silane. In accordance with another feature of the invention, the silane is $Si_nH_{2n+2}$, where $n \geq 1$.

In accordance with a further feature of the invention, the elevated temperature is above 300° C.

In accordance with a further added feature of the invention, the elevated temperature is above 600° C.

In accordance with a further additional feature of the invention, the noble metal layer is a metal selected from a group consisting of ruthenium, rhodium, palladium, rhenium, osmium, platinum, iridium, and gold.

With the foregoing and other objects in view there is also provided, in accordance with the invention, a component including: a noble metal layer made of a material and having a surface; an insulation layer; and a mixed layer serving as an adhesion promoting layer. The surface of the noble metal layer faces the insulation layer. The mixed layer is formed at the surface of the noble metal layer. The mixed layer includes silicon, oxygen, and the material of the noble metal layer.

With the foregoing and other objects in view there is also provided, in accordance with the invention, a semiconductor memory that includes: a plurality of storage capacitors each having two electrodes; a noble metal layer made of a material and having a surface; an insulation layer, and a mixed layer serving as an adhesion promoting layer. The surface of the noble metal layer faces the insulation layer. The mixed layer is formed at the surface of the noble metal layer. The mixed layer includes silicon, oxygen, and the material of the noble metal layer. At least one of the two electrodes is formed by the noble metal layer.

In other words, the object of the invention can be achieved by a method for fabricating a component having the following steps:

a noble metal layer and a silicon layer, which comes into contact with a surface of the noble metal layer, are applied in this order to a substrate;

a siliconization is carried out, in which the surface of the noble metal layer which is in contact with the silicon layer is siliconized;

an oxidation is carried out, in which the silicide layer formed and unsiliconized regions of the silicon layer that may have remained are oxidized; and an insulation layer is applied.

Through the siliconization and oxidation, the applied silicon layer is converted into an oxidized silicide layer. This makes use of the insight that noble metals can be siliconized comparatively simply. The adhesion between the noble metal layer and the silicide layer is very good. The silicide layer formed can subsequently be oxidized in order to provide a good adhesion support for an insulation layer. The siliconization and the oxidation result in a layer with comparatively high intermixing or interdiffusion of silicide or noble metal and silicon oxide. As a result, a relatively large inner surface is formed between the silicide or the noble metal and the silicon oxide, the surface contributing to the improved adhesion. Expressed in a simplified manner, it could also be said that a multilayer adhesion layer is formed which has, proceeding from the noble metal layer, a silicide layer, a mixed layer essentially including noble metal and silicon oxide and a silicon oxide layer. With a silicon layer applied comparatively thin, essentially only a mixed layer is discernible, the concentration of the silicide increasing toward the noble metal layer and that of silicon oxide increasing toward the insulation layer. Generally, it is also possible to speak of a superficial silicon oxide layer on a silicide layer. The precise way in which the oxidized silicide layer is constructed depends to a great extent on the layer thickness of the applied silicon layer, the temperature and the time duration of the siliconization and the oxidation.

The interdiffusion of silicide and silicon oxide is a consequence of the siliconization and oxidation, so that it is also possible to speak of reactive intermixing, i.e. an intermixing on account of different chemical reactions. What has a beneficial effect in this case is that the oxidation begins on the side remote from the noble metal surface, but the siliconization begins on the side of the silicon layer which faces the noble metal layer. Therefore, the two reactions run spatially toward one another.

The oxidation of silicides is described e.g. in S. P. Murarka, "Silicides for VLSI Applications", Academic Press, 1983, 102–143. It can be assumed in a simplified manner that silicide formed in the case of noble metals decomposes and silicon oxide arises. Further indications with regard to the mechanisms executed can be gathered from the technical article by S. Mantl, "Silicid-Mikrostrukturen durch lokale Oxidation" ["Silicide microstructures through local oxidation"], Physikalische Blätter 51 (1995), 951–953. Detailed investigations with regard to the siliconization of noble metal layers, in particular of platinum, are described in C. Canali et al., "Pt$_2$Si and PtSi formation with high-purity PT thin films", Applied Physics Letters, Vol. 31, No. 1, 1977, 43–45.

A further advantage of the method resides in the use of materials that are usually used in the fabrication of components, in particular semiconductor components. Silicon, silicides and silicon oxide are standard materials that are readily controlled technologically.

The siliconization and the oxidation are preferably effected during a common thermal treatment in an oxygen-containing atmosphere. The thermal loading on remaining structures is reduced by virtue of the common treatment. Moreover, oxidized silicide layers fabricated in this way impart a particularly good adhesion between the noble metal layer and the insulation layer. In the case of fabricating semiconductor memories with ferroelectric (e.g. SBT=Strontium Bismuth Tantalate or PZT=lead zirconium titanate) or high-∈ dielectric (BST=Barium Strontium Titanate), the thermal treatment can also be effected in the context of the oxidative treatment of the dielectric.

The siliconization and oxidation can also be carried out in separate steps. Irrespective of the method progression, the surface of the noble metal layer, which is remote from the silicon layer remains free of oxides or silicides.

Without wishing to be restrictive, the mechanism underlying the formation of the oxidized silicon layer is understood as follows in the case of the thermal treatment in an oxygen-containing atmosphere. During the thermal treatment, which is performed at a sufficiently high temperature for the siliconization, the side of the silicon layer which faces the noble metal layer is converted into a silicide layer, while the surface of the silicon layer which is remote from the noble metal layer is oxidized. Accordingly, a silicide layer covered by a silicon oxide layer is initially formed. As the thermal treatment progresses, the silicide decomposes to an increasing extent. The liberated silicon diffuses in the direction of the oxidative atmosphere, that is to say in the direction of the silicon oxide layer already formed. What is thereby achieved at the same time is that no silicon can diffuse through the noble metal to the opposite surface. This surface remains free of silicide in this case. Finally, as the oxidation continues, the initially formed silicide is converted almost completely into silicon oxide and metal, the intermixing being preserved for improvement of the adhesion. The sequence outlined above also corresponds, in principle, to that in the case of separate siliconization and oxidation. Even with initially complete siliconization, silicon oxide forms at the expense of the silicide during the subsequent oxidation. A silicon oxide layer that is greatly intermixed with the noble metal is produced as a result. The extent to which silicide remains depends, in particular, on the temperature and the duration of the treatment.

Particularly preferably, the thermal treatment is effected in the presence of water vapor in order to further reduce the thermal loading, since the oxidation of silicides advances more rapidly in the case of an atmosphere containing water vapor. Alternative methods for the siliconization and the oxidation such as e.g. laser annealing and e-beam scanning are likewise possible.

Preferably, the silicon layer is converted in its entirety in order to achieve the best possible adhesion.

Furthermore, it is preferred if the thicknesses of the silicon layer and of the noble metal layer are coordinated with one another in such a way that, in the event of a complete siliconization of the silicon layer, the noble metal layer is only partially consumed and the surface of the noble metal layer which is remote from the silicon layer remains essentially free of silicides. In this case, the silicon layer should preferably be significantly thinner than the noble metal layer. By way of example, a noble metal layer which is about 10 to 20 times as thick is favorable.

The silicon layer is preferably deposited as a polycrystalline or amorphous layer. Methods suitable for this are e.g. sputtering or plasma-enhanced CVD methods. It is furthermore favorable if silicide is formed in situ during the deposition of the silicon layer. The conditions necessary for this, in particular the required temperature, can easily be realized.

Preferably, the noble metal layer is patterned before the application of the silicon layer, so that edges and side regions of the noble metal layer are also covered by the silicon layer.

It is favorable if:
the noble metal layer is applied to a ferroelectric or dielectric capacitor dielectric covering a further noble metal layer;
the further noble metal layer, the capacitor dielectric and the noble metal layer are patterned using a common mask to form a stack; and
the silicon layer is deposited conformally onto the stack, siliconized and oxidized, the silicon layer being completely oxidized in the region of direct contact with the capacitor dielectric.

The silicon layer should cover the stack as completely as possible. In the region of the capacitor dielectric, the silicon layer is not siliconized, but rather only completely oxidized, so that, peripherally at the outer side of the stack, a completely insulating region is formed within the silicon layer. The noble metal layer and the further noble metal layer are thus electrically insulated from one another.

The application of the insulation layer after the oxidation is likewise preferred, in order to enable an oxidation that is as undisturbed and as complete as possible. If the insulation layer includes silicon oxide, it can also be applied before the oxidation, since silicon oxide is permeable to oxygen. In the case of silicon nitride as an insulation layer, it should be taken into consideration that silicon nitride is an oxygen barrier, so that a correspondingly long time duration must be provided in the case of a subsequent oxidation, depending on the thickness of the silicon nitride layer.

It is furthermore favorable if, before the oxidation, the noble metal layer and the silicon layer are patterned using a mask which is fabricated lithographically. In this case, it is advantageously possible to utilize the properties of the silicon layer as an antireflection layer (ARC=antireflective coating). The deposition of the silicon layer by sputtering is particularly preferable in this case.

It has furthermore been found to be preferred for at least one contact hole to be introduced into the insulation layer and into the oxidized silicide layer and to be filled with a conductive material which produces an electrically conductive connection to the noble metal layer. In this case, after the formation of the contact hole, silicide present at the bottom of the contact hole may be removed in order to reduce the electrical contact resistance. The removal of residual silicide is recommended particularly in the case of iridium as material of the noble metal layer since otherwise the contact resistance is very high.

The material of the noble metal layer is preferably a metal from the group ruthenium, rhodium, palladium, rhenium, osmium, platinum, iridium and gold. Platinum and iridium are particularly preferred. Alloys of the noble metals mentioned are also possible.

The invention is furthermore achieved by a method for fabricating a component having the following steps:
   an insulation layer, a silicon layer and a noble metal layer, which comes into contact with the silicon layer, are applied in this order to a substrate;
   a siliconization is carried out, in which that surface of the noble metal layer which is in contact with the silicon layer is siliconized; and
   an oxidation is carried out in which the silicide layer formed and unsiliconized regions of the silicon layer that may have remained are oxidized.

In this case, the noble metal layer with an underlying silicon layer is applied to the insulation layer. The siliconization and the oxidation likewise lead here to the oxidized silicide layer described further above. The siliconization and oxidation can likewise be carried out in a common thermal treatment.

The invention is furthermore achieved by a method for fabricating a component having the following steps:
   a noble metal layer is applied to a substrate;
   the noble metal layer is exposed, at elevated temperature, to an atmosphere containing at least one silane, so that a silicide layer is formed at the surface of the noble metal layer; and
   an insulation layer is applied.

In this case, the temperatures should be chosen to be high enough that the silane undergoes thermal decomposition. The requisite temperatures of about 300 to 700° C. lie above that required for the siliconization, so that a silicide layer forms in situ on the noble metal surface. By contrast, the deposited silicon is not converted on regions of the insulation layer or of the substrate which are not covered by the noble metal layer. Optionally, an oxidation may subsequently be carried out in order further to improve the adhesion. Without oxidation, the adhesion to the insulation layer that is finally applied is promoted just by the silicide layer formed in situ, which is sufficient for many purposes.

Silanes of the general formula $Si_nH_xR_y$ where $n \geq 1$ and x, $y \geq 0$ are employed. In this case, $R_y$ denotes a radical, which is e.g. $CH_3$, $NH_2$, halogens, in particular F or C.

An unsubstituted silane, in particular a carbon-free silane, is preferably used. Carbon-free silanes have the advantage, in particular, of producing carbon-free silicides, or of preventing the incorporation of carbon into the $SiO_2$/noble metal mixed phase.

Silanes of the form $Si_nH_{2n+2}$ where $n>1$, in particular silane $SiH_4$), disilane ($Si_2H_6$) and trisilane ($Si_3H_8$), are particularly preferred.

During the deposition, the elevated temperature should lie above 300° C., in particular above 600° C.

The method is preferably used for fabricating a semiconductor memory having a multiplicity of storage capacitors each having two electrodes and a capacitor dielectric lying in between, at least one of the two electrodes being formed by the noble metal layer.

The invention furthermore relates to a component having a noble metal layer and an insulation layer. Such a component is known from Issued German Patent DE 196 01 592 C1 already cited.

In order to improve the adhesion between the noble metal layer and the insulation layer, the invention proposes that a mixed layer serving as an adhesion promoting layer is formed at the surface of the noble metal layer which faces the insulation layer. The mixed layer includes the material of the noble metal layer, silicon and oxygen.

The mixed layer can be obtained in particular by using the inventive method. The material of the noble metal layer is in particular a metal from the group ruthenium, rhodium, palladium, rhenium, osmium, platinum, iridium and gold. Platinum and iridium are particularly preferred. Alloys of the noble metals mentioned are also possible. Preferably, a ferroelectric or dielectric capacitor dielectric adjoins the surface of the noble metal layer which is remote from the insulation layer.

Preferably, the component is a semiconductor memory having a multiplicity of storage capacitors, at least one of the two electrodes being formed by the noble metal layer.

Other features which are considered as characteristic for the invention are set forth in the appended claims.

Although the invention is illustrated and described herein as embodied in a method for fabricating a component, and component having a metal layer and an insulation layer, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 9A and 9B show EDX spectra at different depths of the oxidized silicide layer.

DESCRIPTION OF THE PREFERRED EMBODIMENTS

Merely for the purpose of better illustration, the invention is described with reference to fabricating a semiconductor memory having a storage capacitor with a dielectric or ferroelectric capacitor dielectric. However, it goes without saying that the invention is not restricted thereto and can be employed whenever the adhesion between a noble metal layer and an insulation layer should be improved.

Figure 1A:
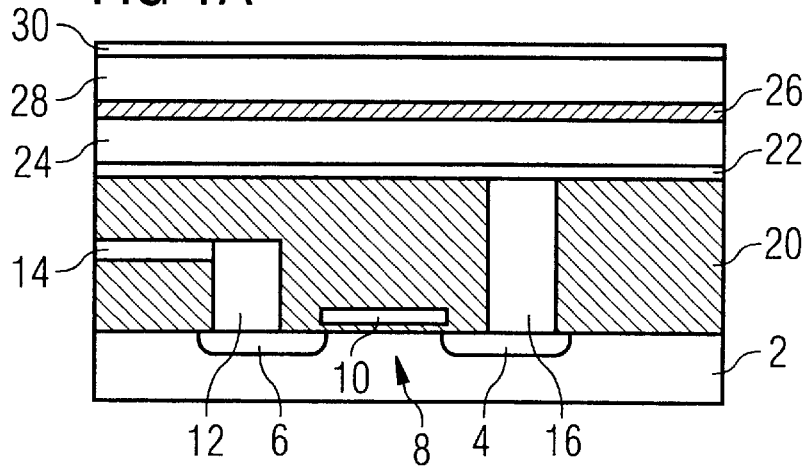
FIGS. 1A–1E show individual method steps of the fabrication method.

Referring now to the figures of the drawing in detail and first, particularly, to FIG. 1A thereof, there is shown a basic substrate 2 made of monocrystalline silicon, in which doping regions 4 and 6 of a selection transistor 8 are embedded. Reference numeral 10 designates the gate electrode of the selection transistor 8. One of the doping regions 6 is connected to a bit line 14 via a conductive plug 12. A further plug 16 leads from the other doping region 4 to the storage capacitor's bottom electrode that will be formed. The plugs 12, 16, which include e.g. doped polysilicon, the bit line 14 and also the gate electrode 10 are embedded in a planarized insulation layer 20.

In the case of a storage capacitor with a dielectric or ferroelectric capacitor dielectric, an oxygen barrier layer is required between the plug 16 including polysilicon and the bottom electrode in order to protect the plug 16 against oxidation during the deposition of the capacitor dielectric. To that end, a corresponding barrier layer 22 is deposited onto the insulation layer 20. The barrier layer may be constructed in monolayer or multilayer fashion. Suitable materials are mentioned e.g. in Published European Patent Application EP 0 697 718 A1. Particular preference is attached to a construction of the barrier layer including an oxygen-containing iridium layer and an iridium oxide layer as is described in Published German Patent application DE 198 60 080 A1 and Published German Patent application DE 199 09 295 A1, the disclosures of which are hereby incorporated by reference in their entirety. The barrier layer has a good adhesion to the noble metal layer that will subsequently be applied.

The barrier layer 22 has deposited onto it a noble metal layer 24 (bottom electrode) preferably including platinum, a capacitor dielectric 26, a noble metal layer 28 (top electrode) which likewise preferably includes platinum, and also a silicon layer 30. Suitable materials for the capacitor dielectric 26 are metal oxides, in particular having ferroelectric and high-Å-dielectric properties, as are mentioned e.g. likewise in Published German Patent applications DE 198 60 080 A1 and DE 199 09 295 A1. The adhesion of the noble metal layer 28 to an insulation layer that will subsequently be applied is intended to be improved by using the silicon layer 30. The thickness of the noble metal layer 28 is about 100 nm, and that of the silicon layer 30 is about 5 nm.

Figure 1B:
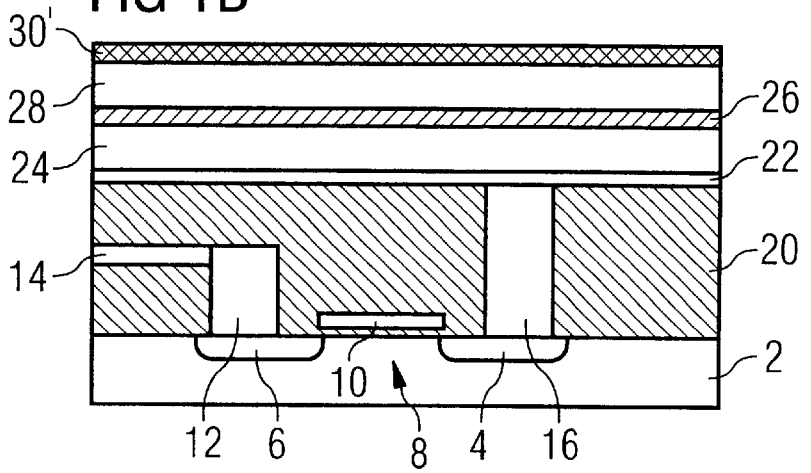

The silicon layer is converted by using a thermal treatment in an oxygen-containing atmosphere at a temperature of above 350° C., in particular at temperatures around 750° C. In this case, the siliconization commences from the side of the silicon layer 30 that faces the noble metal layer 28 and the oxidation commences from the opposite side of the silicon layer 30. The noble metal layer 28 is siliconized superficially in this case. Since the noble metal layer 28 has a significantly greater thickness than the silicon layer 30, the surface of the noble metal layer 28, which is remote from the silicon layer 30 and faces the capacitor dielectric 26 remains free of silicides. In the event of lengthy thermal treatment (in total about 20 min), the initially formed silicide (platinum silicide in the present case) decomposes, the liberated silicon oxidizing. A mixed layer (oxidized silicide layer) including silicon oxide, noble metal, and if appropriate, silicide, which is characterized by a high degree of interdiffusion, is present as a result. The conversion is illustrated diagrammatically by the hatched layer 30' in FIG. 1B. For more extensive indications of the mechanisms underlying the oxidation of silicides, reference is made to the already cited publication by S. P. Murarka, "Silicides for VLSI Applications", Academic Press, 1983, 102–143. The process conditions during the siliconization and oxidation can correspondingly be easily adapted in accordance with the desired purpose of use and the noble metals used.

The silicon layer can be applied by different methods. Possible methods are:

a) Application of an amorphous silicon layer having a thickness of about 10 nm by DC sputtering. Such methods are used for example when sputtering antireflection layers (ARC) for the g-line lithography of metal layers.

b) Plasma-enhanced chemical vapor deposition (PE-CVD). Typical conditions are 100 sccm gas flow of $SiH_4$, 400° C. deposition temperature, 5 torr (approximately 660 Pa) and 500 W RF power.

c) Deposition of a polysilicon layer or amorphous silicon by using a thermally activated LP-CVD method (low-pressure chemical vapor deposition) using $SiH_4$ or $SiH_2C_2$ at temperatures of between 600° C. and 700° C. and a pressure of between 70(approximately 9310 Pa) and 100 torr (approximately 13 300 Pa). Plasma enhancement may optionally be provided. Since the siliconization already commences at below 350° C. in the case of platinum, the siliconization in this case takes place at least partially in situ. More extensive details with regard to the siliconization of platinum, in particular with regard to the conversion temperature, speed of formation and the underlying mechanism, can be gathered from the already mentioned technical article by C. Canali et al., "$Pt_2Si$ and PtSi formation with high-purity PT thin films", Applied Physics Letters, Vol. 31, No. 1, 1977, 43–45. An additional ex situ siliconization step may subsequently likewise be carried out. Silicide layers just a few monolayers thick can be produced by this method.

Since the starting materials used partly contain hydrogen, an annealing step in an oxygen-containing atmosphere should be provided in order to anneal the damage brought about by the hydrogen in the ferroelectric or dielectric capacitor dielectric. Each subsequent deposition of the insulation layer (oxide, e.g. silicon oxide, or nitride, e.g. silicon nitride) can likewise be effected in situ.

The oxidized silicide layer can be formed either in a single thermal treatment or in successive treatments. It is also possible to carry out the formation of the oxidized silicide layer in the context of the annealing step required for the conditioning of the capacitor dielectric (also referred to as ferro-anneal in the case of a ferroelectric dielectric).

The following conditions, in particular, appear to be advantageous for the thermal treatment in a water-vapor-containing atmosphere: temperatures in excess of 600° C. for about 30 min. Higher temperatures such as 900° C. are necessary for a complete oxidation of the noble metal silicide.

Figure 1C:
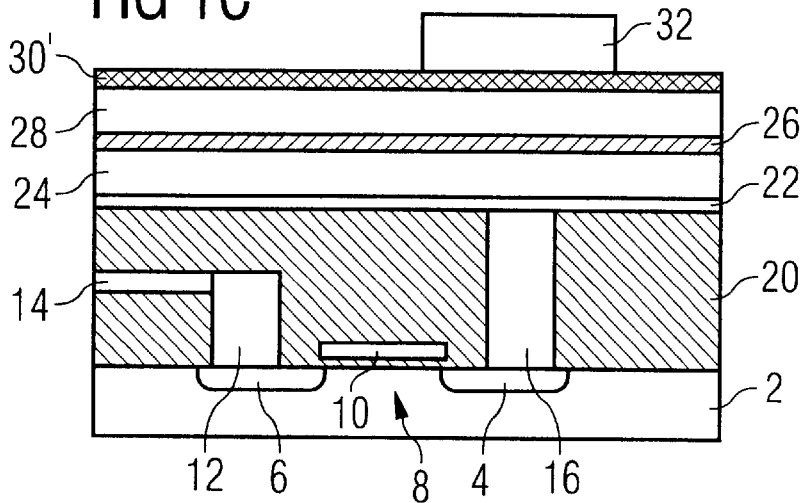
Figure 1D:
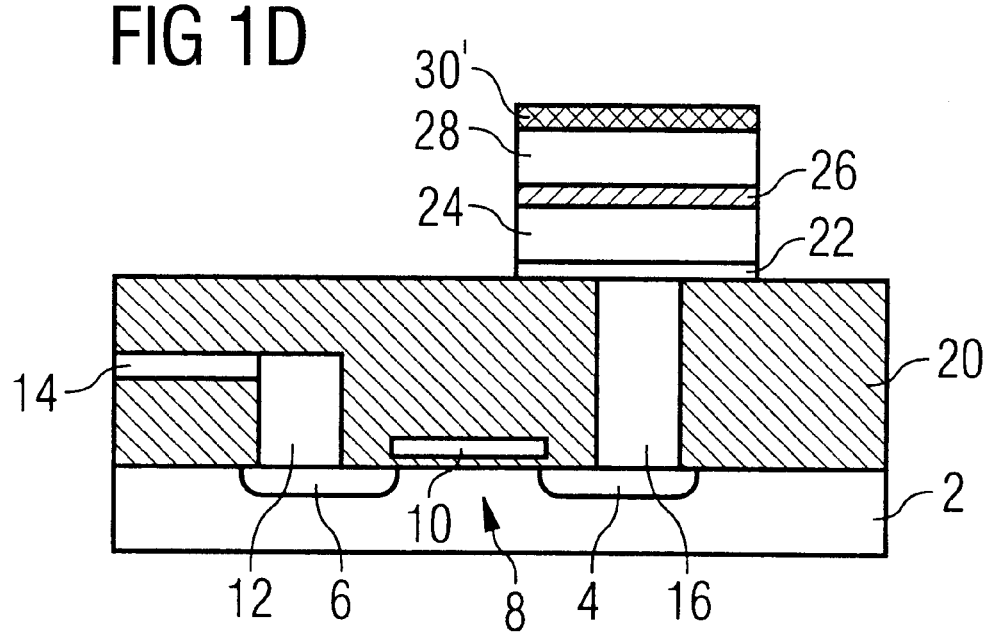
Figure 1E:
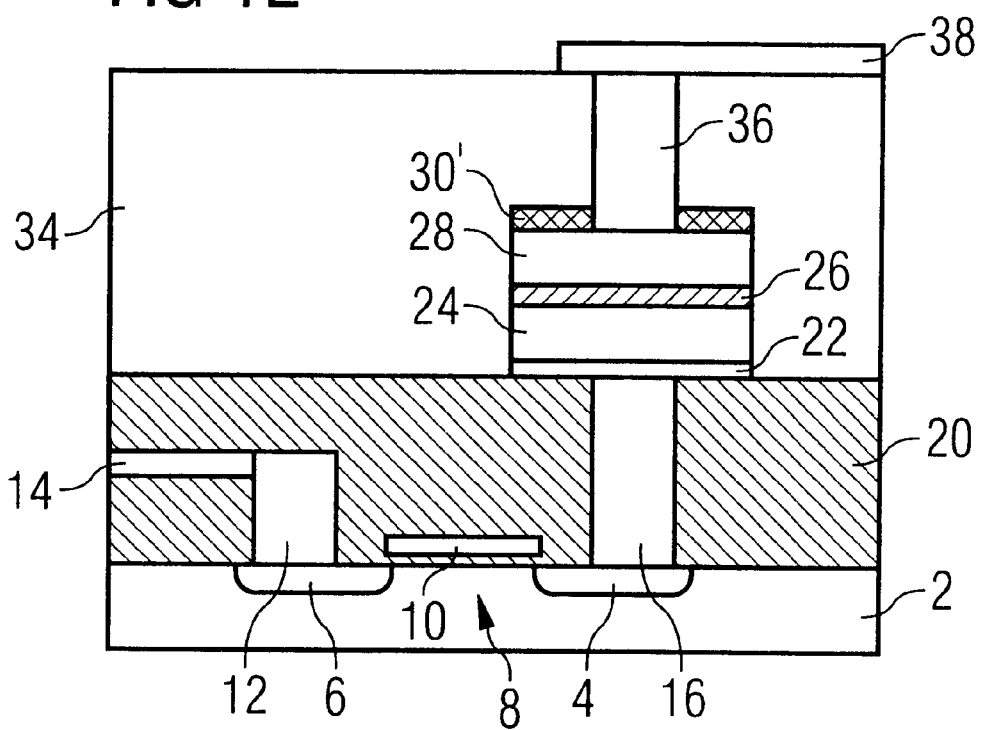

After the formation of the oxidized silicon layer 30', a mask 32 is applied in accordance with FIG. 1C. The mask is used for the patterning of all the layers up to and including the barrier layer 22. A hard mask is preferably involved, e.g. made of titanium nitride or silicon dioxide. After the patterning using an anisotropic etching method (e.g. argon sputtering or chlorine/argon high-temperature RIE), a stack including barrier layer 22, noble metal layer 24, capacitor dielectric 26, noble metal layer 28 and oxidized silicide layer 30' is seated on the insulation layer 20, as shown in FIG. 1D. In accordance with FIG. 1E, an insulation layer 34 made of e.g. oxide is applied to the stack and the uncovered insulation layer 20 and is planarized. Using a mask that is not specifically illustrated here, a contact hole 36 reaching down to the noble metal layer 28 is etched into the insulation layer 34 and the oxidized silicon layer 30'. In this case, silicide that is possibly present at the bottom of the contact hole 36 should likewise be removed in order that the contact resistance between the noble metal layer 28 and the conductive material with which the contact hole 36 is filled is kept as low as possible. An interconnect 38 produces the electrical connection to the electrode 28.

The adhesion between the noble metal layer 28 and the insulation layer is significantly improved by means of the oxidized silicide layer 30'.

Figure 2A:
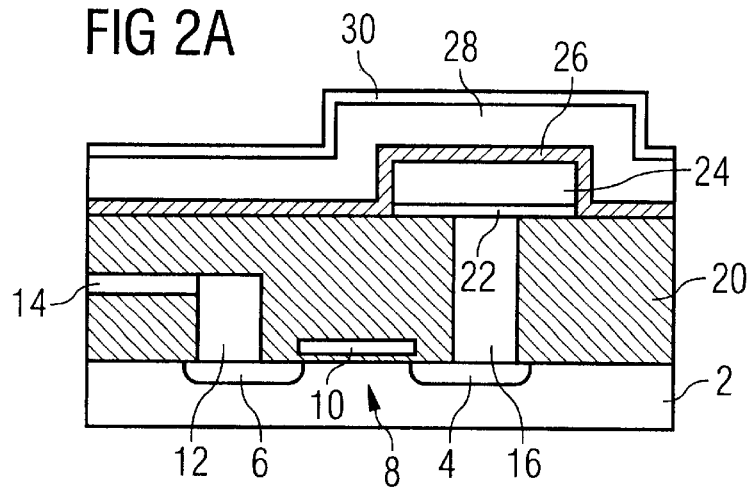
FIGS. 2A–2C show individual method steps of a further embodiment of the fabrication method.
Figure 2B:
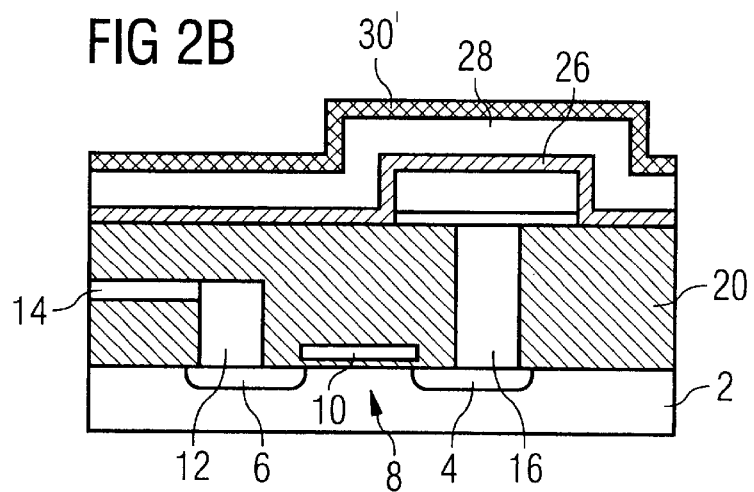
Figure 2C:
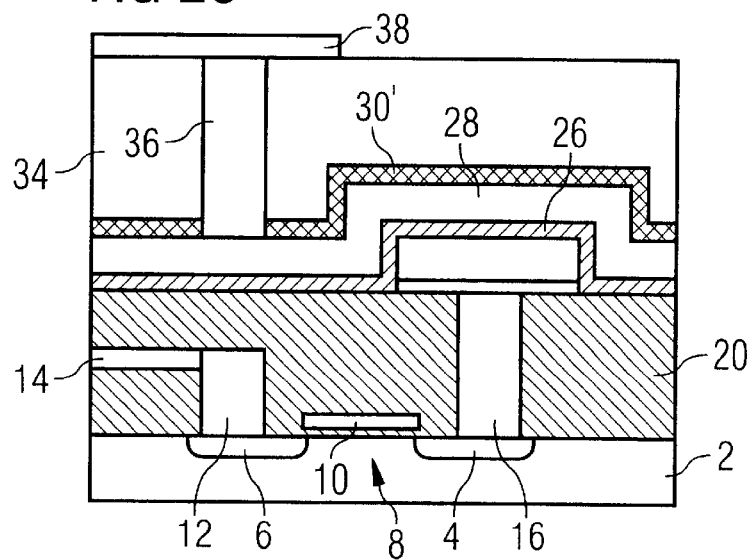

FIGS. 2A to 2C illustrate another method sequence. As shown in FIG. 2A, the noble metal layer 24 and the barrier layer 22 are patterned before the capacitor dielectric 26, the noble metal layer 28 and the silicon layer 30 are deposited conformally. In this case, the side areas of the patterned noble metal layer 24 are also available as effective capacitor area, as a result of which the capacitance of the capacitor is increased. As a result, with the capacitance remaining the same, it is possible to fabricate smaller capacitors, as a result of which the integration density can be increased.

After the silicon layer 30 has been converted into an oxidized silicide layer 30' by siliconization and oxidation, as shown in FIG. 2B, the insulation layer 34 is applied, and the contact hole 36 and the interconnect 38 are fabricated as shown in FIG. 2C. The capacitor dielectric 26, the noble metal layer 28 and the oxidized silicide layer 30'are not patterned in large sections and cover adjacent memory cells. The noble metal layer 28 thus constitutes a common top electrode for a plurality of storage capacitors. This also means that fewer contact holes 36 are required for the contact connection of the noble metal layer 28, as a result of which the integration density can be increased further. Moreover, the noble metal layer is covered with the oxidized silicide layer over a larger area, as a result of which the adhesion is improved further.

Figure 3A:
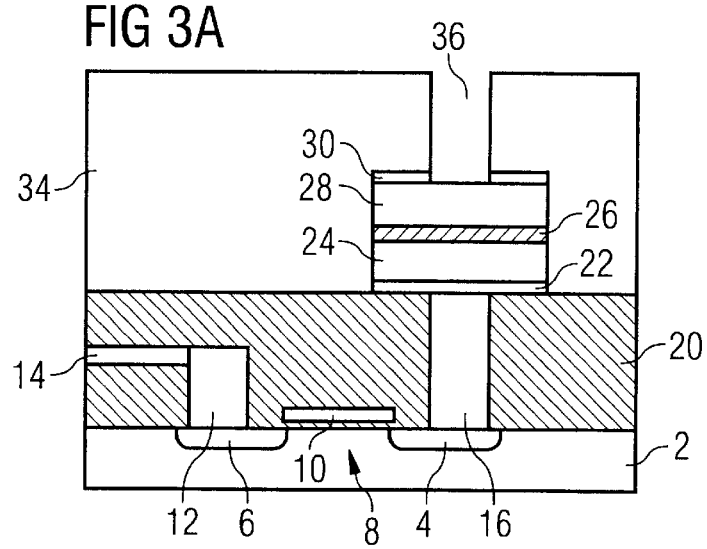
FIGS. 3A–3C show individual method steps of a further embodiment of the fabrication method.
Figure 3B:
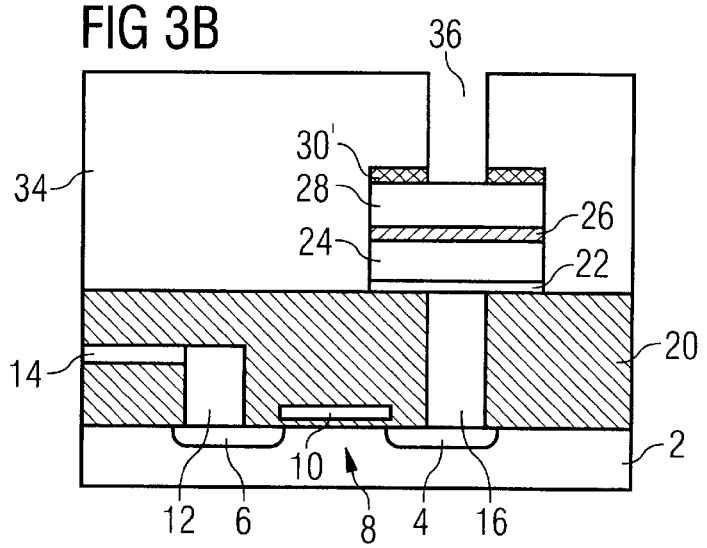
Figure 3C:
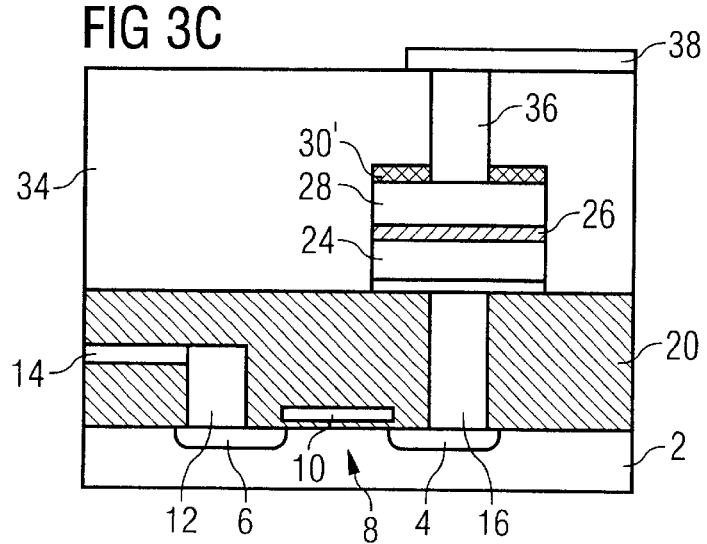

The method sequence shown in FIGS. 3A to 3C differs from that illustrated in FIGS. 1A to 1E in particular in the fact that here the silicon layer 30 is converted into the oxidized insulation layer by the thermal treatment only after the deposition of the insulation layer 34 and the formation of the contact hole 36. Provided that the siliconization does not already commence in situ during the deposition of the silicon layer 30', it is also the case with this method sequence that no silicide can form at the bottom of the contact hole.

Figure 4A:
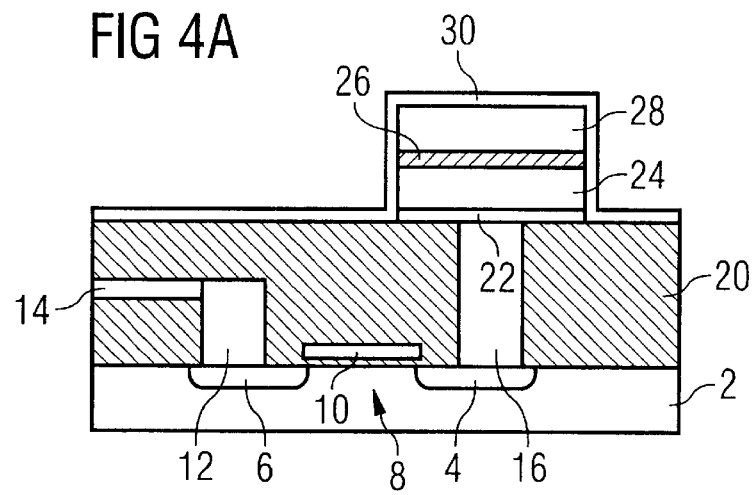
FIGS. 4A–4C show individual method steps of a further embodiment of the fabrication method.
Figure 4B:
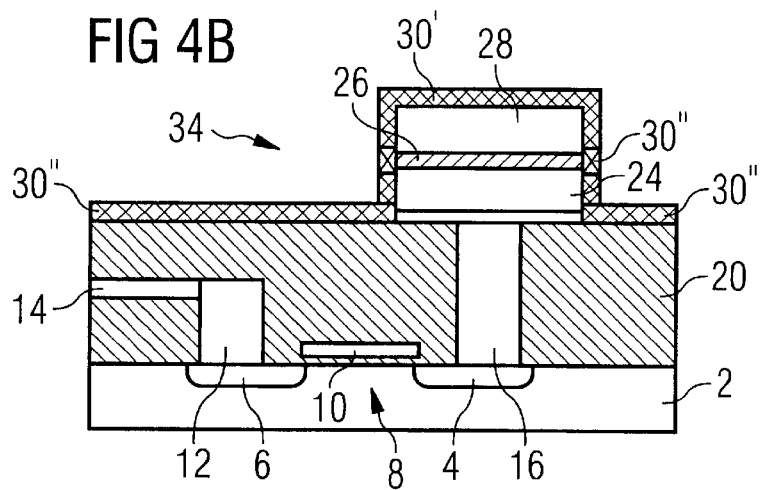
Figure 4C:
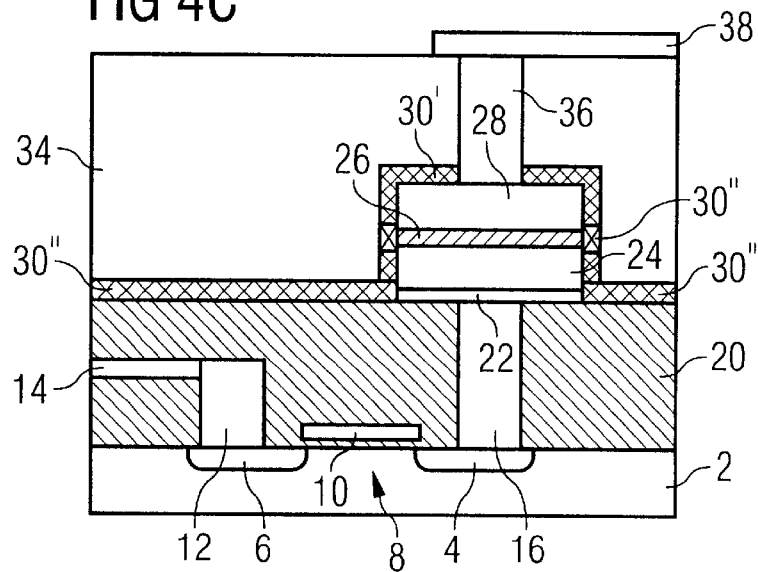
Figure 5A:
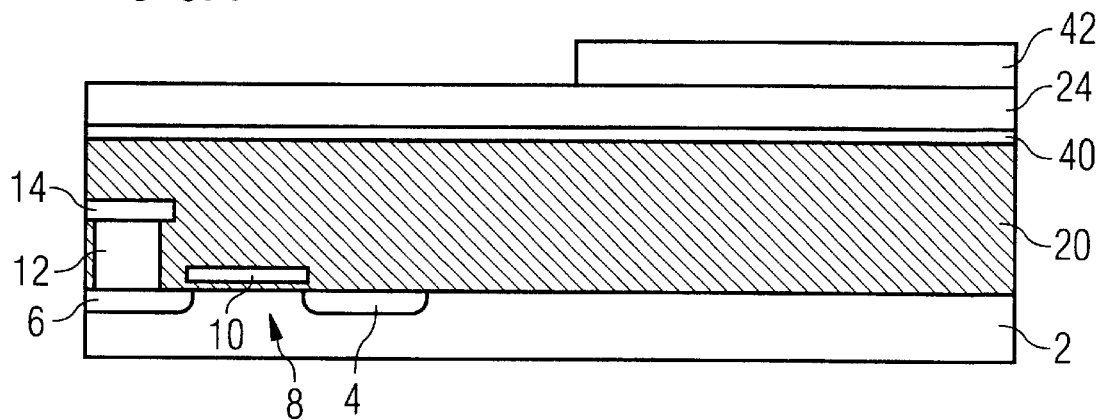
FIGS. 5A–5F show individual method steps of a further embodiment of the fabrication method.
Figure 5B:
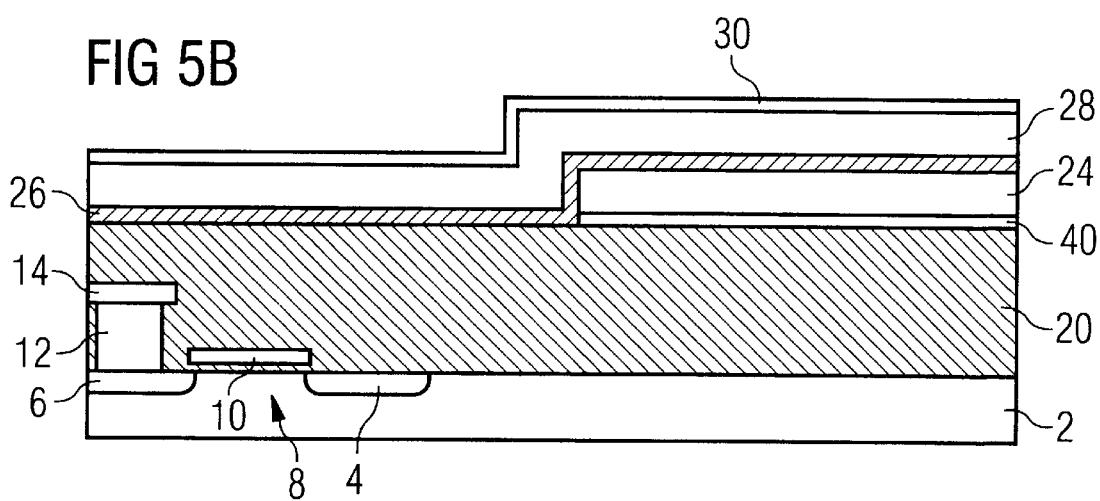
Figure 5C:
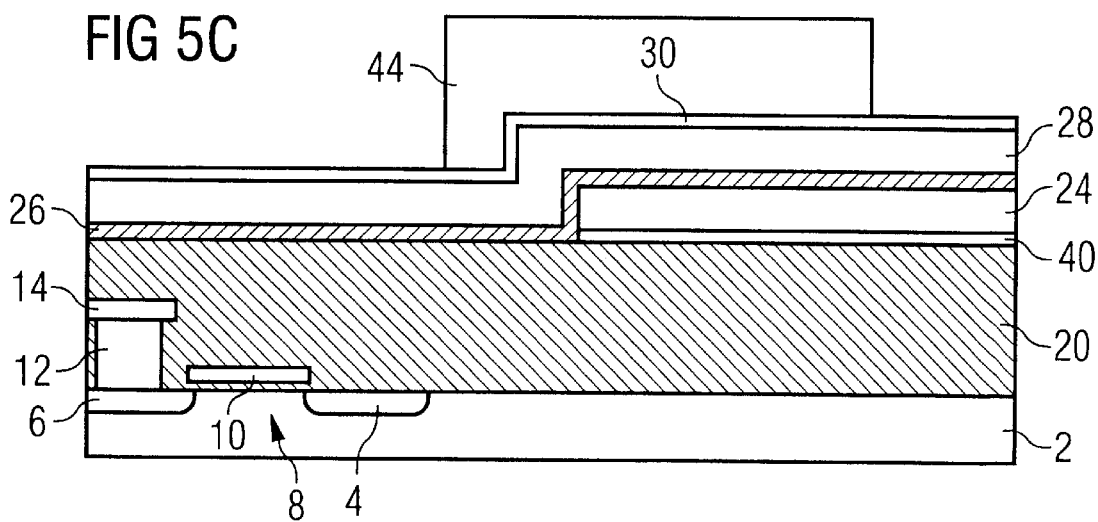
Figure 5D:
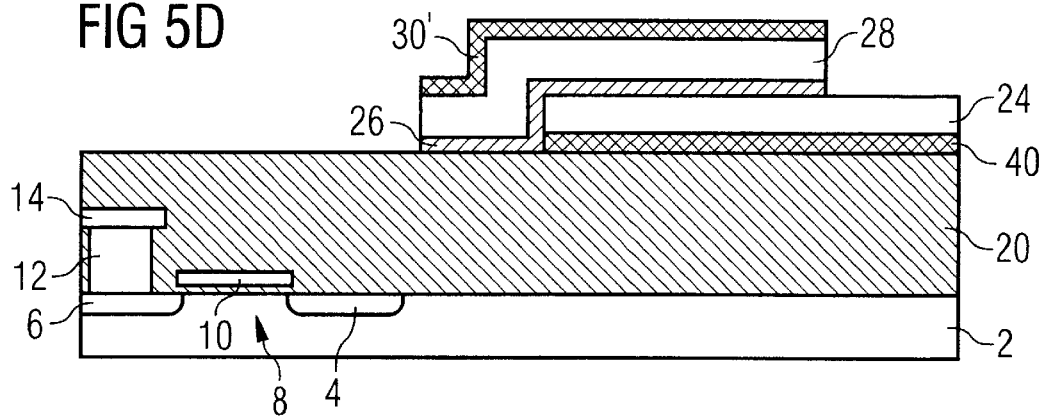
Figure 5E:
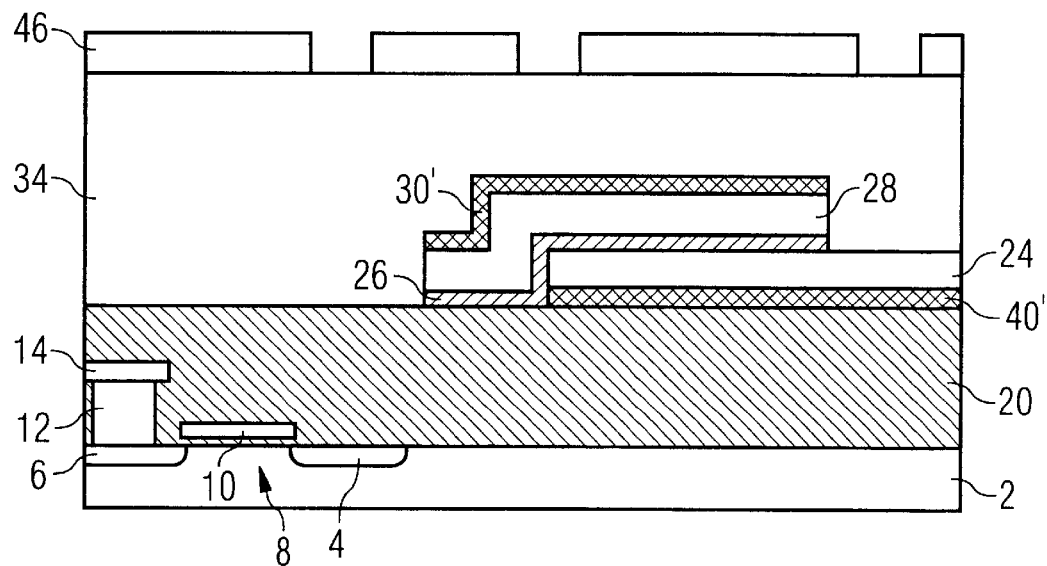
Figure 5F:
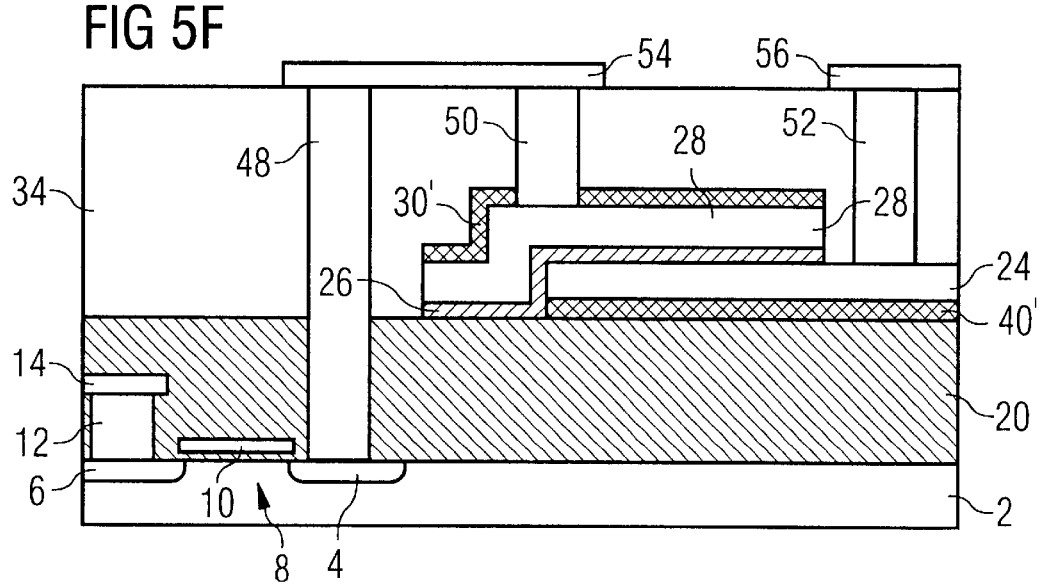
Figure 6A:
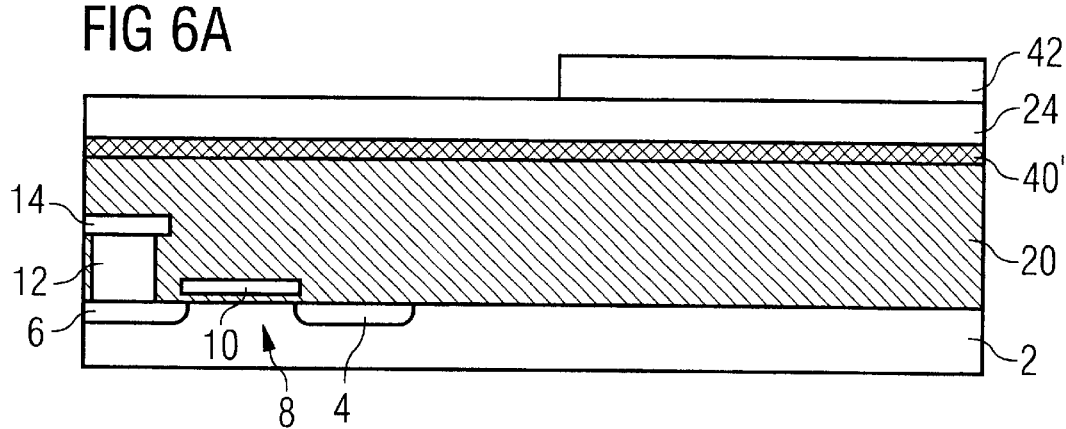
FIGS. 6A–6E show individual method steps of a further embodiment of the fabrication method.
Figure 6B:
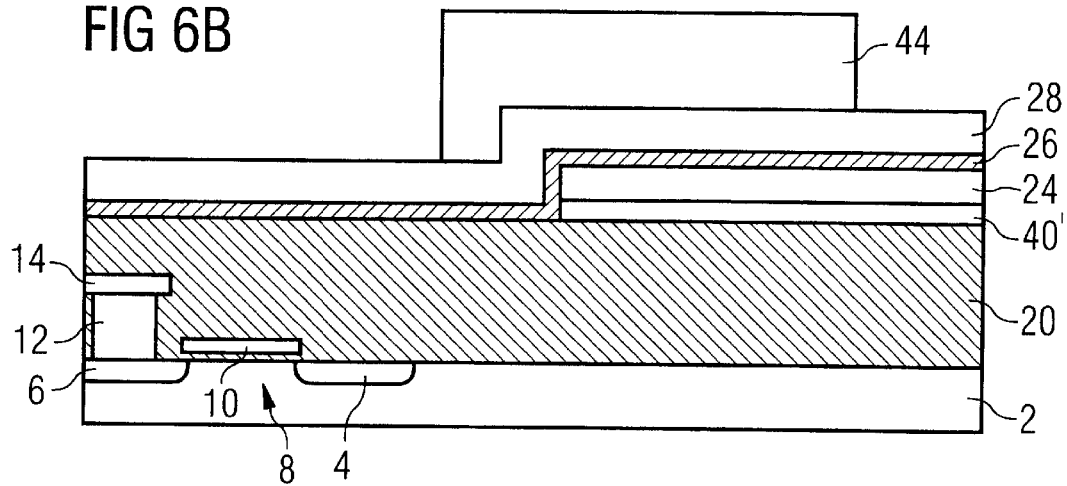
Figure 6C:
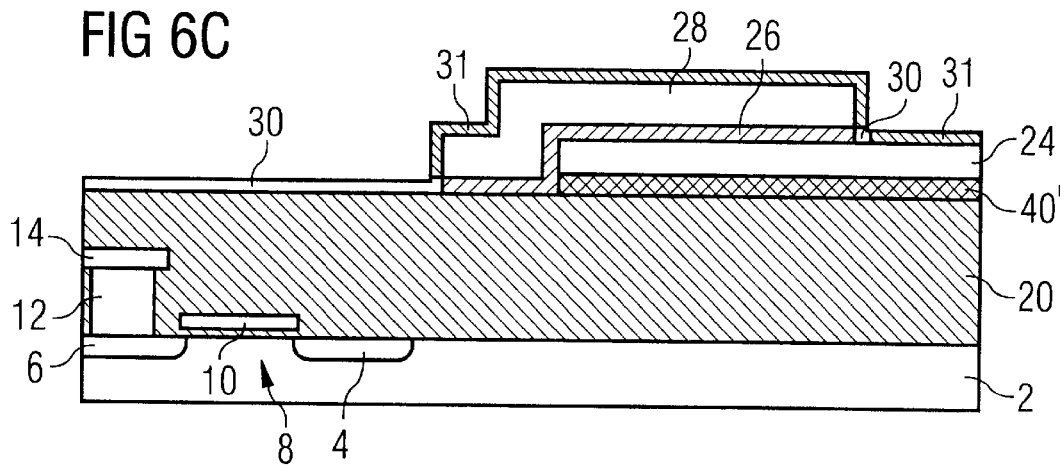
Figure 6D:
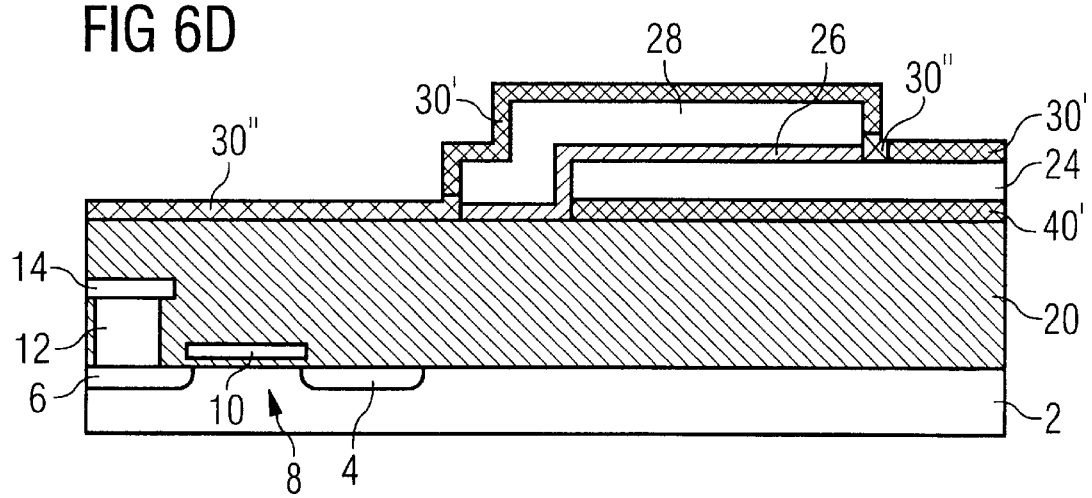
Figure 6E:
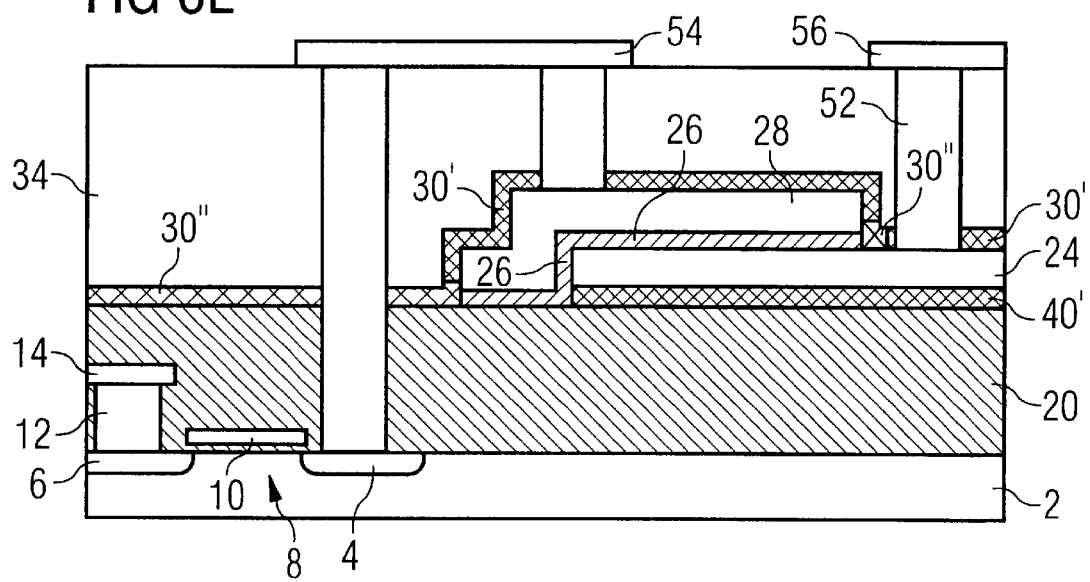

In the case of the method sequence shown in FIGS. 4A–4C, the barrier layer 22, the noble metal layer 24, the capacitor dielectric 26 and the noble metal layer 28 are patterned before the silicon layer 30 is deposited conformally onto the stack formed by the patterning. The silicon layer 30 is subsequently converted. Since the silicon layer 30 does not come into contact with the noble metal in the regions of the capacitor dielectric 26, which is uncovered at the side areas of the stack, and on the uncovered surface of the insulation layer 20, the silicon layer 30 is also not siliconized there, but rather is completely converted into a silicon oxide layer 30". The silicon oxide ring that forms along the uncovered regions of the capacitor dielectric ensures an insulation between noble metal layer 28 and 24.

FIGS. 5A to 5F illustrate a method sequence in which the adhesion between the lower noble metal layer 24 and the insulation layer 20 is additionally improved by using an oxidized silicide layer. The storage capacitor fabricated in this case is also referred to as an offset capacitor in contrast to the stacked capacitor shown in FIGS. 1 to 4.

A silicon layer 40 and a noble metal layer 24 are deposited onto the insulation layer 20, which includes e.g. silicon oxide, and is patterned using a mask 42. The capacitor dielectric 26, the noble metal layer 28 and the silicon layer 30 are deposited onto the layers thus patterned and are patterned using a further mask 44. In this case, the silicon layer 30 simultaneously serves as an antireflection layer during the lithographic fabrication of the mask 44. In order to obtain results that are as optimal as possible in this case, the thickness of the silicon layer is set in accordance with the wavelength of the radiation used for the exposure.

The silicon layers 30 and 40 are subsequently converted in each case into an oxidized silicide layer 30' and 40', respectively, by using a thermal treatment. Contact holes (plugs) 48, 50 and 52 are made in the subsequently applied insulation layer 34 by using a third mask 46 and are filled with a conductive material. In this case, the contact hole 48 penetrates through both the insulation layer 34 and the insulation layer 20 and reaches as far as the doping region 4 of the selection transistor 8. An interconnect 54 seated on the insulation layer 34 connects the contact hole 48 to the contact hole 50, which reaches as far as the noble metal layer 28 (top electrode), and thus produces an electrically conductive connection between the noble metal layer 28 and the doping region 4. The noble metal layer 24 (bottom electrode) is contact-connected by the contact hole 52, which reaches as far as the noble metal layer 24, and an interconnect 56 that is likewise seated on the insulation layer 34.

In the method sequence shown in FIGS. 6A to 6E, in contrast to that illustrated in FIGS. 5A to 5F, the siliconization of the silicon layer 30 is already carried out at least partly during the deposition thereof (in situ). In addition, the silicon layer 40 has already been converted into an oxidized silicide layer 40' before the patterning of the noble metal layer 24. This makes use of the fact that noble metals such as platinum are permeable to oxygen. The noble metal layer 24 and the oxidized silicide layer 40' are likewise patterned using the mask 42. The subsequently applied capacitor dielectric 26 and the noble metal layer 28 are patterned using the mask 44. During the subsequent deposition of the silicon layer 30, an in situ siliconization is effected where the silicon layer comes into direct contact with the noble metal layer 24 or 28, respectively. Accordingly, a silicide layer 31 and a silicon layer 30 are present. For the deposition, use is made of a silane having the general formula $Si_nH_xR_y$ where $n \geq 1$ and $x,y \geq 0$, in which case $R_y$ denotes a radical, which is e.g. $CH_3$, $NH_2$, halogens, in particular F or C. $SiH_4$, $Si_2H_6$ and $Si_2H_2C_2$ are particularly preferred. The deposition is effected in a thermally activated manner, i.e. at sufficiently high temperatures that enable a thermal decomposition of the silane. Suitable conditions are e.g. 700° C., 2 torr, $SiH_4$/Ar atmosphere. An additional oxidation of the silicon layer 30 or of the silicide layer 31 formed in situ can be dispensed with here. In this case, the non-siliconized regions 30 can be removed selectively with respect to the siliconized regions 31 in order to avoid short circuits between the noble metal layers 24 and 28. Otherwise, the non-siliconized regions 30 are completely oxidized during the oxidation (regions 30"). The subsequent steps correspond to those of FIGS. 5E and 5F.

The in situ siliconization without subsequent oxidation is also possible, of course, in the case of the structures shown in FIGS. 1 to 4. In the case of the structures of FIGS. 1, 2 and 3, in particular, there is no risk of a short circuit as a result of non-converted silicon. In the case of the structure in accordance with FIG. 4, by contrast, the non-converted silicon should be removed or converted into an insulator by an oxidation.

Figure 7A:
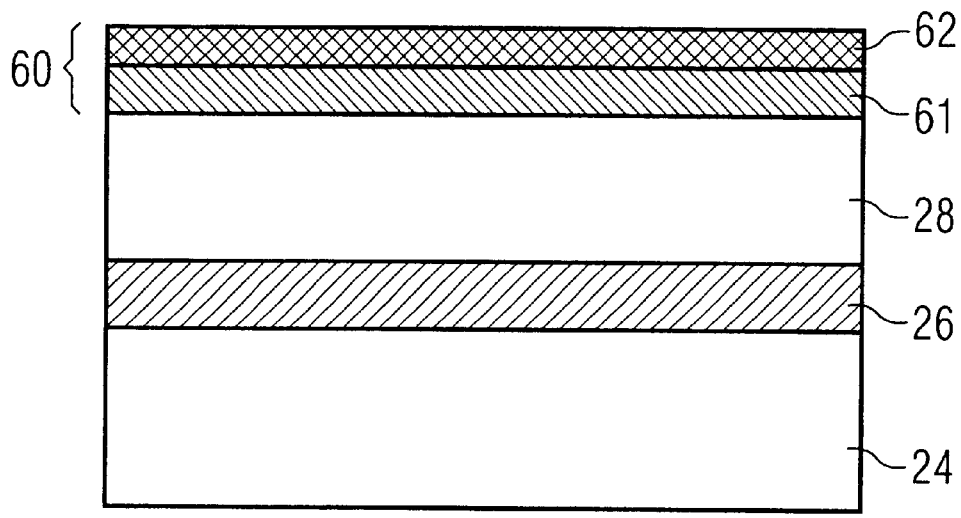
FIGS. 7A–7C show partial views of a storage capacitor with an oxidized silicide layer.

FIG. 7A shows an enlarged detail from a capacitor in which the silicon layer 60 has been applied on the noble metal layer 28 and has already been partially converted. The lower region 61 represents metal silicide, while the upper region 62 includes silicon oxide. As the oxidation progresses, the silicide formed decomposes and the liberated silicon oxidizes.

Figure 7B:
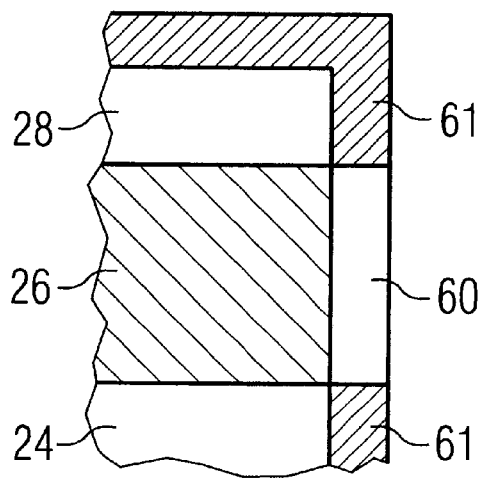
Figure 7C:
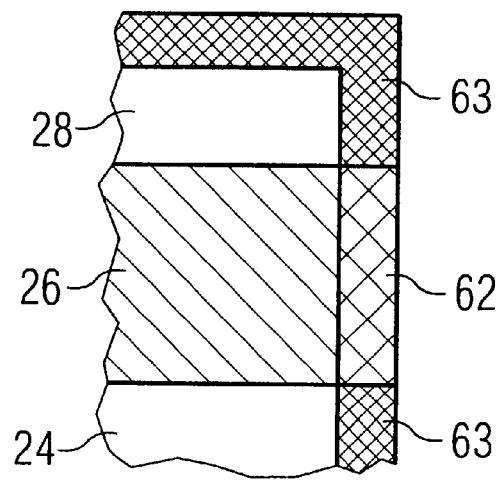

FIGS. 7B and 7C show the side edge of a capacitor, onto which the silicon layer 60 has likewise been deposited and converted into a silicide layer 61 by a first thermal treatment. By contrast, silicon layer 60 remains without conversion in the region of the capacitor dielectric 26, which is uncovered at the side edge. Only during the subsequent oxidation (FIG. 7C) is this region 62 oxidized, while the remaining region of the silicon layer 60 (silicide layer 61) is converted into an oxidized silicide layer 63.

Figure 8:
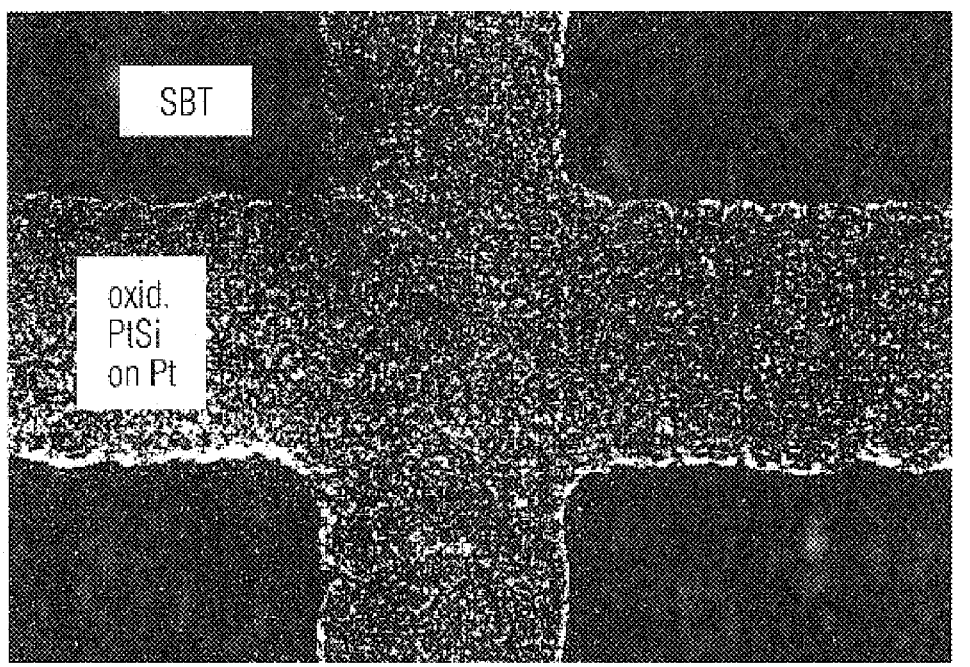
FIG. 8 shows an SEM photograph of a noble metal structure coated with an oxidized silicide layer.

FIG. 8 shows a platinum structure covered with an oxidized silicide layer. The oxidized silicide layer has a polycrystalline structure.

Figure 9A:
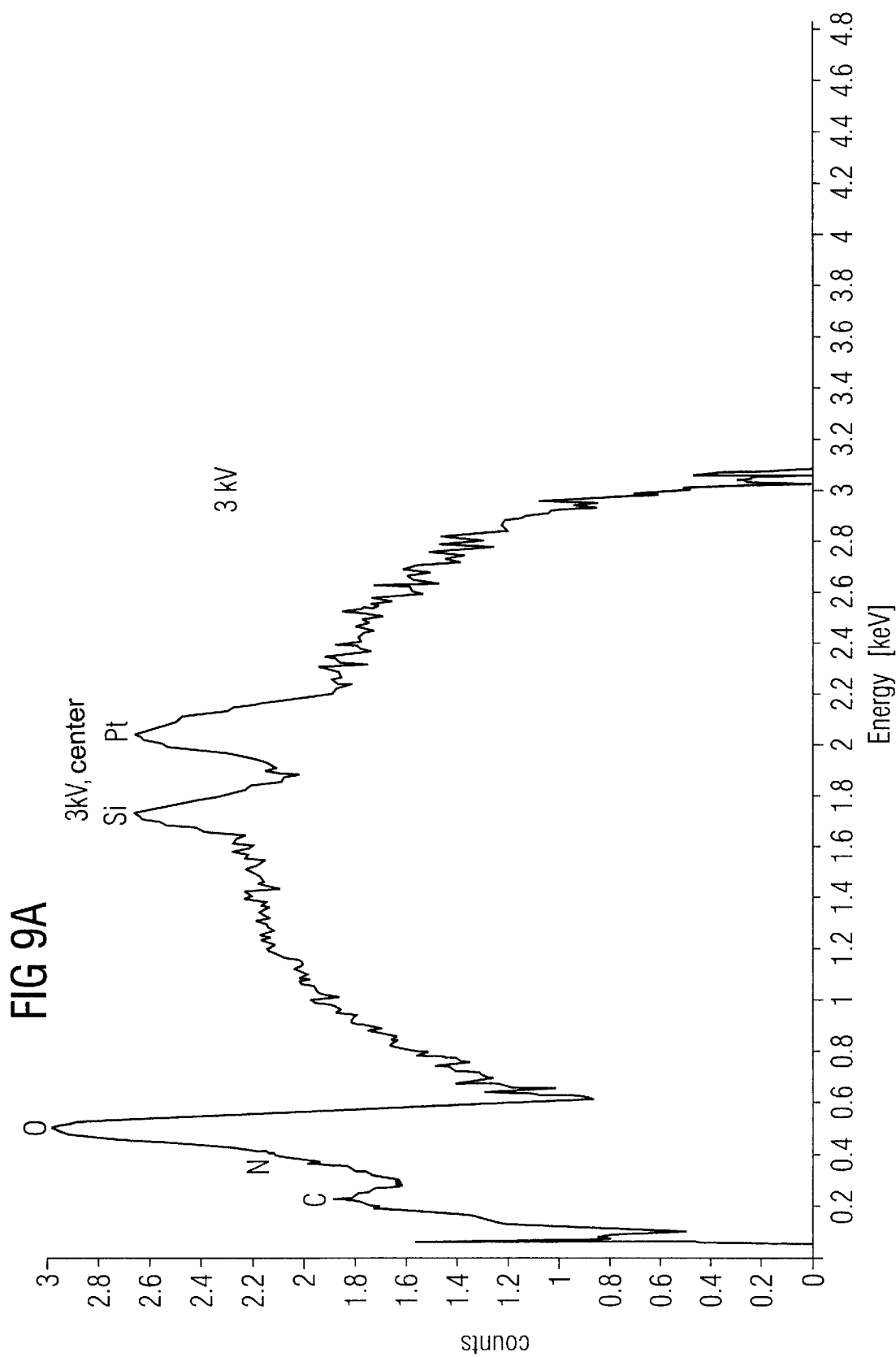

The composition of the oxidized silicide layer is illustrated in FIGS. 9A and 9B, which show EDX (energy-dispersive X-ray analysis) spectra at different depths, set by acceleration voltages of different magnitudes. It can be seen that the proportion of oxygen is comparatively high at a relatively small depth (FIG. 9A). The signals for silicon and platinum are approximately identical. In deeper layers (FIG. 9B), the proportion of platinum increases, by contrast, and that of silicon and oxygen decreases, by contrast. The layer examined was fabricated under the following conditions:

a) Deposition of a layer stack including a platinum layer, an SBT layer, and a platinum layer;

b) Deposition of a nitride layer (silicon nitride) having a thickness of about 50 nm by using a plasma-enhanced CVD method at 400° C. using silane. As early as during the stabilization step (setting of the flows at the predetermined temperature) and during the ignition of the plasma, a platinum silicide is formed on account of the decomposition of the silane;

c) Thermal treatment in oxygen at 500° C. for 3 hours and 800° C. for 15 minutes;

d) Removal of the nitride layer by using a plasma etching method ($CF_4$/oxygen etching process with low $V_{DC}$ in a P5000 M×P installation from Applied Materials Inc.; and e) Aftertreatment in oxygen at 700° C. for about 30 minutes.

Without being restrictive, it is presumed that the oxidation of the silicide layer is essentially effected during step e), since the nitride layer represents an oxygen barrier. However, oxygen and $H_2O$ must also diffuse out of the SBT layer and contribute to the oxidation.

We claim:

1. A component, comprising:

a noble metal layer made of a material and having a surface;

an insulation layer; and a mixed layer serving as an adhesion promoting layer;

said surface of said noble metal layer facing said insulation layer;

said mixed layer formed at said surface of said noble metal layer; and said mixed layer including silicon, oxygen, and said material of said noble metal layer.

2. The component according to claim 1, wherein said material of said noble metal layer is a metal selected from a group consisting of ruthenium, rhodium, palladium, rhenium, osmium, platinum, iridium, and gold.

3. The component according to claim 1, comprising:

a capacitor dielectric;

said noble metal layer having a surface remote from said insulation layer; and said surface of said noble metal layer, remote from said insulation layer, adjoins said capacitor dielectric.

4. The component according to claim 3, wherein said capacitor dielectric is a ferrolelectric capacitor dielectric.

5. A semiconductor memory, comprising:

a plurality of storage capacitors each having two electrodes;

a noble metal layer made of a material and having a surface;

an insulation layer; and a mixed layer serving as an adhesion promoting layer;

said surface of said noble metal layer facing said insulation layer;

said mixed layer formed at said surface of said noble metal layer;

said mixed layer including silicon, oxygen, and said material of said noble metal layer;

at least one of said two electrodes being formed by said noble metal layer.

* * * * *